(12) United States Patent
Cho et al.

(10) Patent No.: US 8,466,617 B2
(45) Date of Patent: Jun. 18, 2013

(54) ORGANIC ELECTROLUMINESCENCE DISPLAY APPARATUS

(75) Inventors: Daihan Cho, Yongin (KR); Minsu Kim, Yongin (KR); Heechul Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/330,956

(22) Filed: Dec. 20, 2011

(65) Prior Publication Data

US 2012/0181923 A1    Jul. 19, 2012

(30) Foreign Application Priority Data

Jan. 14, 2011    (KR) .................. 10-2011-0004196

(51) Int. Cl.
*H05B 33/00*    (2006.01)

(52) U.S. Cl.
USPC ....... 313/512; 313/504; 345/173; 359/483.01

(58) Field of Classification Search
None
See application file for complete search history.

(56) References Cited

U.S. PATENT DOCUMENTS

| | | | |
|---|---|---|---|
| 6,707,450 B2 | 3/2004 | Ahn et al. | |
| 7,948,179 B2 * | 5/2011 | Koshihara et al. | 313/512 |
| 2005/0030294 A1 | 2/2005 | Ahn et al. | |
| 2009/0096761 A1 | 4/2009 | Cho | |
| 2010/0123672 A1 | 5/2010 | Kim | |
| 2010/0134439 A1 | 6/2010 | Ito et al. | |
| 2011/0080372 A1 * | 4/2011 | Lee et al. | 345/174 |
| 2011/0187692 A1 * | 8/2011 | Jung | 345/211 |

FOREIGN PATENT DOCUMENTS

| | | |
|---|---|---|
| JP | 2009-099141 A | 5/2009 |
| JP | 2010-122563 A | 6/2010 |
| KR | 10-0234651 B1 | 1/2000 |
| KR | 10-2001-0094773 A | 11/2001 |
| KR | 10-2009-0037547 A | 4/2009 |
| KR | 10-2010-0054419 A | 5/2010 |
| WO | WO 02/075438 | 9/2002 |

* cited by examiner

*Primary Examiner* — Ashok Patel

(74) *Attorney, Agent, or Firm* — Lee & Morse, P.C.

(57) ABSTRACT

An organic electroluminescence display apparatus includes an organic light emitting layer disposed on a substrate, a thin film sealing layer on the organic light emitting layer, the thin film sealing layer being configured to seal the organic light emitting layer, a polarizer disposed on the thin film sealing layer, a touch screen panel disposed on the polarizer, and a window layer disposed on the touch screen panel.

14 Claims, 5 Drawing Sheets

ORGANIC ELECTROLUMINESCENCE DISPLAY APPARATUS

CROSS-REFERENCE TO RELATED APPLICATIONS

This U.S. non-provisional patent application claims priority under 35 U.S.C. §119 of Korean Patent Application No. 10-2011-004196, filed on Jan. 14, 2011, the entire contents of which are hereby incorporated by reference.

BACKGROUND

The present disclosure herein relates to a display apparatus, and more particularly, to an organic light emitting display apparatus.

Display apparatuses may be classified into organic electroluminescence display apparatuses, liquid crystal display apparatuses, and plasma display apparatuses. The organic electroluminescence display apparatuses are self-luminescent type display apparatuses that use electroluminescence of an organic material. Since the organic electroluminescence display apparatuses can be driven at low voltage, and have wide viewing angles and high response speed, they have been regarded with much interest as next generation displays.

Such an organic electroluminescence display apparatus includes a cathode, an anode, and an organic light emitting layer disposed therebetween. The organic light emitting layer may include a phosphorescent compound. Electrons provided from the cathode are combined with holes provided from the anode in the organic light emitting layer to form excitons. The excitons transition from an excited state to a ground state to emit light. Organic electroluminescence display apparatuses can express various colors by using organic light emitting layers that emit light of different colors.

Recently, a technology of attaching a touch screen panel to a front surface of an organic electroluminescence display apparatus has been developed to variously control images on a display. When the organic electroluminescence display apparatus and the touch screen panel are separately fabricated, the entire thickness of the display apparatus may increase, and the transmittance and colors thereof may be degraded.

SUMMARY

The present disclosure provides an organic light emitting display apparatus with a reduced thickness.

Embodiments provide organic electroluminescence display apparatuses including an organic light emitting layer disposed on a substrate, a thin film sealing layer on the organic light emitting layer, the thin film sealing layer being configured to seal the organic light emitting layer, a polarizer disposed on the thin film sealing layer, a touch screen panel disposed on the polarizer, and a window layer disposed on the touch screen panel.

The organic electroluminescence display apparatus my further include a first optical adhesive between the touch screen panel and the window layer.

The organic electroluminescence display apparatus may further include an optical resin layer configured to adhere the polarizer to the touch screen panel.

The substrate may include an image display region and a non-image display region, the optical resin layer being on the image display region.

The optical resin layer may have a closed loop shape.

The organic electroluminescence display apparatus may further include a second optical adhesive between the polarizer and the thin film sealing layer.

The organic electroluminescence display apparatus may further include a third optical adhesive between the polarizer and the touch screen panel.

The organic electroluminescence display apparatus may further include a first optical resin layer adhering the polarizer to the touch screen panel, and a second optical resin layer adhering the window layer to the touch screen panel.

The organic electroluminescence display apparatus may further include a driver integrated circuit on a non-image display region of the substrate.

The organic light emitting layer, the thin film sealing layer, the polarizer, and the touch screen panel may be disposed on an image display region of the substrate.

The polarizer may extend from the image display region to the non-image display region, the polarizer being spaced apart from the driver integrated circuit and surrounding at least two side surfaces of the driver integrated circuit.

The touch screen panel may extend from the image display region to the non-image display region.

The touch screen panel and the organic light emitting layer may share a single substrate.

The thin film sealing layer may consist essentially of a plurality of thin films.

BRIEF DESCRIPTION OF THE DRAWINGS

The accompanying figures are included to provide a further understanding of the example embodiments, and are incorporated in and constitute a part of this specification. The drawings illustrate some of the example embodiments and, together with the description, serve to explain principles thereof. In the figures.

DETAILED DESCRIPTION

Figure 1:
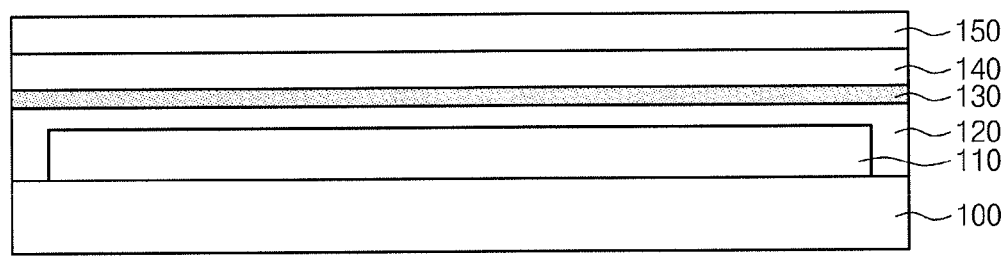
FIG. 1 is a cross-sectional view illustrating an organic electroluminescence display apparatus according to an embodiment.

Example embodiments will now be described with reference to the accompanying drawings. However, example embodiments may include different forms and should not be construed as limited to the embodiments set forth herein. Rather, these embodiments are provided so that this disclosure will be thorough and complete, and will fully convey the scope to those skilled in the art.

In this specification, it will also be understood that when an element is referred to as being 'on' another element or 'between' other elements, it can be directly on or between the other elements, or intervening elements may also be present. Like reference numerals refer to like elements throughout.

Additionally, embodiments in the detailed description will be described with reference to cross-sectional views as ideal exemplary views. In the figures, the dimensions of layers and regions may be exaggerated for clarity of illustration. Accordingly, shapes of the exemplary views may be modified according to manufacturing techniques and/or allowable tolerances. Therefore, the embodiments are not limited to the specific shapes illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a device region. Thus, this should not be construed as limiting the scope of the example embodiments. Also, though terms like a first, a second, and a third are used to describe various components in various embodiments, the components are not limited to these terms. These terms are only used to distinguish one component from another component. Embodiments described and exemplified herein include complementary embodiments thereof.

In the following description, the technical terms are used only for explaining a specific exemplary embodiment while not limiting the inventive concept. The terms of a singular form may include plural forms unless referred to the contrary. The meaning of 'comprises' and/or 'comprising' does not exclude other components besides a mentioned component.

FIG. 1 is a cross-sectional view illustrating an organic electroluminescence display apparatus according to an embodiment.

Referring to FIG. 1, an organic light emitting layer 110 may be disposed on a substrate 100. The organic light emitting layer 110 may include a plurality of thin film transistors (not shown) and a plurality of light emitting devices (not shown).

A thin film sealing layer 120 may seal the organic light emitting layer 110, e.g., the organic light emitting layer 110 may be sealed between the substrate 100 and the thin film sealing layer 120. The thin film sealing layer 120 may be formed by repeatedly stacking organic layers and inorganic layers, e.g., the thin film sealing layer 120 may essentially consist of a plurality of thin films. The thin film sealing layer 120 may prevent permeation of moisture from the outside into the organic light emitting layer 110. The thin film sealing layer 120 may absorb moisture remaining on the organic light emitting layer 110. As the thin film sealing layer 120 is formed of a plurality of thin films, an overall thickness of the thin film sealing layer 120 may be substantially smaller than that of a conventional sealing substrate. Therefore, the thin film sealing layer 120 may be used to reduce thickness of the organic electroluminescence display apparatus.

A polarizer 130 may be disposed on the thin film sealing layer 120. The polarizer 130 may improve the rectilinear propagation of light emitted from the organic light emitting layer 110, thereby preventing scattering or interference of light and improving the color quality of the light. The polarizer 130 may selectively transmit light incident from the outside and prevent reflection of light incident from the outside, thereby improving the visual display of an image provided by the organic electroluminescence display apparatus.

A touch screen panel 140 may be disposed on the polarizer 130, e.g., the touch screen panel 140 may be a capacitive type touch screen panel. The touch screen panel 140 may include sensing patterns (not shown) and metal lines (not shown). Capacitive variations of the sensing patterns may be transmitted to an integrated circuit through the metal lines. Instead of forming the touch screen panel 140 on an additional substrate, e.g., on a separate substrate, the touch screen panel 140 may be formed on a same substrate, i.e., substrate 100, as the organic light emitting layer 110, e.g., the touch screen panel may be integrally formed with the substrate 100. For example, a single substrate, i.e., the substrate 100, may be used to support both the organic light emitting layer 110 and the touch screen panel 140. For example, the sensing patterns and metal lines of the touch screen panel 140 may be deposited on, e.g., directly on, the polarizer 130. As at least one layer is eliminated, i.e., a separate substrate for the touch screen panel 140, the entire thickness of the organic electroluminescence display apparatus may be decreased.

A window layer 150 may be disposed on the touch screen panel 140. The window layer 150 may be a part for a human hand or an object to contact.

According to the current embodiment, an organic electroluminescence display apparatus may include an integrated touch screen panel. That is, the touch screen panel 140 integrally formed with the substrate 100, and the thin film sealing layer 120 may reduce thickness of the organic electroluminescence display apparatus. The polarizer 130 may improve the visual display of the organic electroluminescence display apparatus.

Figure 2:
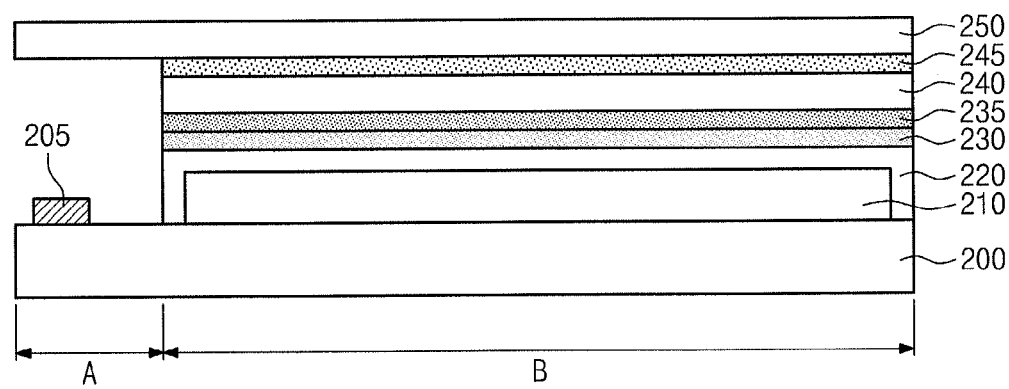
FIG. 2 is a cross-sectional view illustrating an organic electroluminescence display apparatus according to another embodiment.

FIG. 2 is a cross-sectional view illustrating an organic electroluminescence display apparatus according to another embodiment. A detailed description of elements described previously with reference to FIG. 1 will not be repeated here.

Referring to FIG. 2, a substrate 200 may include a non-image display region "A" and an image display region "B". An organic light emitting layer 210 may be disposed on the image display region "B". A thin film sealing layer 220 sealing the organic light emitting layer 210 may be disposed on the image display region "B". The thin film sealing layer 220 may be formed by repeatedly stacking organic layers and inorganic layers. A driver integrated circuit (IC) 205 may be disposed on the non-image display region A. The driver IC 205 may control the operation of the organic light emitting layer 210.

A polarizer 230 may be disposed on the thin film sealing layer 220. An optical resin layer 235 may be disposed on the polarizer 230. A touch screen panel 240 may be disposed on the optical resin layer 235. The optical resin layer 235 may adhere between the polarizer 230 and the touch screen panel 240.

A window layer 250 may be disposed on the touch screen panel 240. The window layer 250 may be a part for a human hand or an object to contact. An optical adhesive 245 may be disposed between the touch screen panel 240 and the window layer 250.

According to the current embodiment, an organic electroluminescence display apparatus may include an integrated touch screen panel. The touch screen panel 240 integrally formed with the substrate 200, and the thin film sealing layer 220 may reduce thickness of the organic electroluminescence display apparatus. The polarizer 230 may improve visual display of the organic electroluminescence display apparatus. The optical resin layer 235 and the optical adhesive 245 may increase fabrication efficiency of the organic electroluminescence display apparatus.

Figure 3:
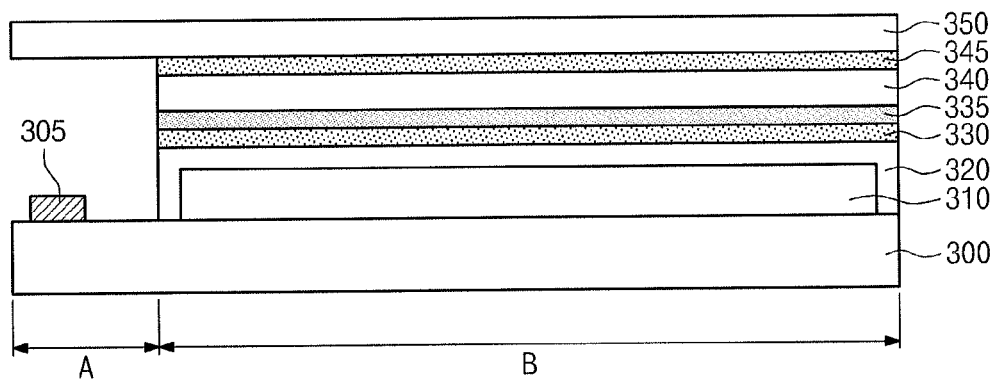
FIG. 3 is a cross-sectional view illustrating an organic electroluminescence display apparatus according to another embodiment.

FIG. 3 is a cross-sectional view illustrating an organic electroluminescence display apparatus according to another embodiment. A detailed description of elements described previously with reference to FIG. 1 will not be repeated here.

Referring to FIG. 3, a substrate 300 may include the non-image display region "A" and the image display region "B". An organic light emitting layer 310 may be disposed on the image display region "B". A thin film sealing layer 320 sealing the organic light emitting layer 310 may be disposed on the image display region "B". The thin film sealing layer 320 may be formed by repeatedly stacking organic layers and inorganic layers. A driver IC 305 may be disposed on the non-image display region A. The driver IC 305 may control the operation of the organic light emitting layer 310.

A polarizer 335 may be disposed on the thin film sealing layer 320. A second optical adhesive 330 may adhere between the thin film sealing layer 320 and the polarizer 335. A touch screen panel 340 may be disposed on the polarizer 335. A window layer 350 may be disposed on the touch screen panel 340. The window layer 350 may be a part for a human hand or an object to contact. A first optical adhesive 345 may be disposed between the touch screen panel 340 and the window layer 350.

According to the current embodiment, an organic electroluminescence display apparatus may include an integrated touch screen panel. The touch screen panel 340 integrally formed with the substrate 300, and the thin film sealing layer 320 may reduce thickness of the organic electroluminescence display apparatus. The polarizer 335 may improve the visual display of the organic electroluminescence display apparatus. The first and second optical adhesives 330 and 345 may increase fabrication efficiency of the organic electroluminescence display apparatus.

Figure 4:
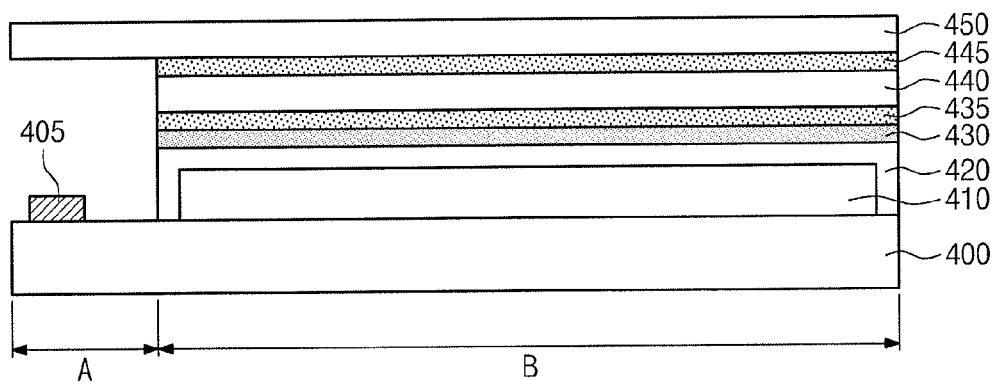
FIG. 4 is a cross-sectional view illustrating an organic electroluminescence display apparatus according to another embodiment.

FIG. 4 is a cross-sectional view illustrating an organic electroluminescence display apparatus according to another embodiment. A detailed description of elements described previously with reference to FIG. 1 will not be repeated here.

Referring to FIG. 4, a substrate 400 may include the non-image display region "A" and the image display region "B". An organic light emitting layer 410 may be disposed on the image display region "B". A thin film sealing layer 420 sealing the organic light emitting layer 410 may be disposed on the image display region "B". The thin film sealing layer 420 may be formed by repeatedly stacking organic layers and inorganic layers. A driver IC 405 may be disposed on the non-image display region A. The driver IC 405 may control the operation of the organic light emitting layer 410.

A polarizer 430 may be disposed on the thin film sealing layer 420. A touch screen panel 440 may be disposed on the polarizer 430. A window layer 450 may be disposed on the touch screen panel 440. A first optical adhesive 435 may adhere between the polarizer 430 and the touch screen panel 440. A second optical adhesive 445 may be disposed between the touch screen panel 440 and the window layer 450.

According to the current embodiment, an organic electroluminescence display apparatus may include an integrated touch screen panel. The touch screen panel 440 formed with the substrate 400, and the thin film sealing layer 420 may reduce thickness of the organic electroluminescence display apparatus. The polarizer 430 may improve the visual display of the organic electroluminescence display apparatus. The first and second optical adhesives 435 and 445 may increase fabrication efficiency of the organic electroluminescence display apparatus.

Figure 5:
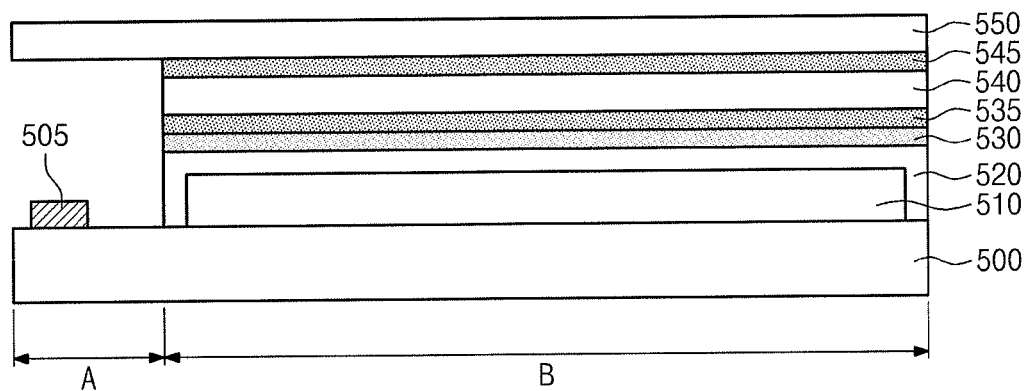
FIG. 5 is a cross-sectional view illustrating an organic electroluminescence display apparatus according to another embodiment.

FIG. 5 is a cross-sectional view illustrating an organic electroluminescence display apparatus according to another embodiment. A detailed description of elements described previously with reference to FIG. 1 will not be repeated here.

Referring to FIG. 5, a substrate 500 may include the non-image display region "A" and the image display region "B". An organic light emitting layer 510 may be disposed on the image display region "B". A thin film sealing layer 520 sealing the organic light emitting layer 510 may be disposed on the image display region "B". The thin film sealing layer 520 may be formed by repeatedly stacking organic layers and inorganic layers. A driver IC 505 may be disposed on the non-image display region A. The driver IC 505 may control the operation of the organic light emitting layer 510.

A polarizer 530 may be disposed on the thin film sealing layer 520. A touch screen panel 540 may be disposed on the polarizer 530. A window layer 550 may be disposed on the touch screen panel 540. A first optical resin layer 535 may adhere between the polarizer 530 and the touch screen panel 540. A second optical resin layer 545 may be disposed between the touch screen panel 540 and the window layer 550.

According to the current embodiment, an organic electroluminescence display apparatus may include an integral touch screen panel. The touch screen panel 540 integrally formed with the substrate 500, and the thin film sealing layer 520 may reduce thickness of the organic electroluminescence display apparatus. The polarizer 530 may improve the visual display of the organic electroluminescence display apparatus. The first and second optical resin layers 535 and 545 may increase fabrication efficiency of the organic electroluminescence display apparatus.

Figure 6:
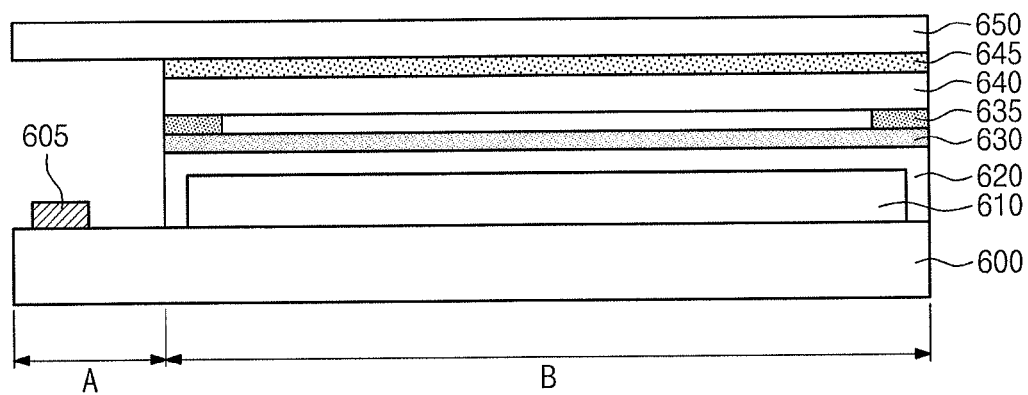
FIGS. 6 and 7 are schematic views illustrating an organic electroluminescence display apparatus according to another embodiment.
Figure 7:
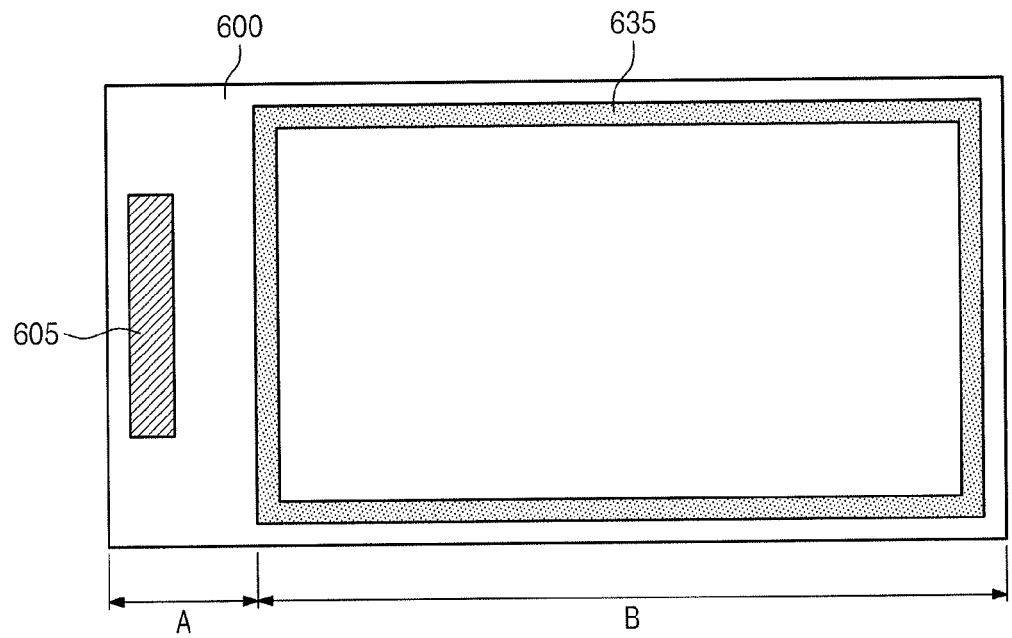

FIG. 6 is a schematic view illustrating an organic electroluminescence display apparatus according to another embodiment, and FIG. 7 is a top plan view of an optical resin layer in the display apparatus of FIG. 6. A detailed description of elements described previously with reference to FIG. 1 will not be repeated herein.

Referring to FIGS. 6 and 7, a substrate 600 may include the non-image display region "A" and the image display region "B". An organic light emitting layer 610 may be disposed on the image display region "B". A thin film sealing layer 620 sealing the organic light emitting layer 610 may be disposed on the image display region "B". The thin film sealing layer 620 may be formed by repeatedly stacking organic layers and inorganic layers. A driver IC 605 may be disposed on the non-image display region A. The driver IC 605 may control the operation of the organic light emitting layer 610.

A polarizer 630 may be disposed on the thin film sealing layer 620. An optical resin layer 635 may be disposed on the polarizer 630. A touch screen panel 640 may be disposed on the optical resin layer 635. The optical resin layer 635 may adhere the polarizer 630 to the touch screen panel 640. The optical resin layer 635 may be disposed at edges of the image display region "B". For example, referring to FIG. 7, the optical resin layer 635 may have a closed curve shape surrounding the, e.g., entire, perimeter of the image display region "B".

A window layer 650 may be disposed on the touch screen panel 640. The window layer 650 may be a part for a human hand or an object to contact. An optical adhesive 645 may be disposed between the touch screen panel 640 and the window layer 650.

According to the current embodiment, an organic electroluminescence display apparatus may include an integrated touch screen panel. The touch screen panel 640 integrally formed with the substrate 600, and the thin film sealing layer 620 may reduce thickness of the organic electroluminescence display apparatus. The polarizer 630 may improve the visual display of the organic electroluminescence display apparatus. The optical resin layer 635 and the optical adhesive 645 may increase manufacturing efficiency of the organic electroluminescence display apparatus.

Figure 8:
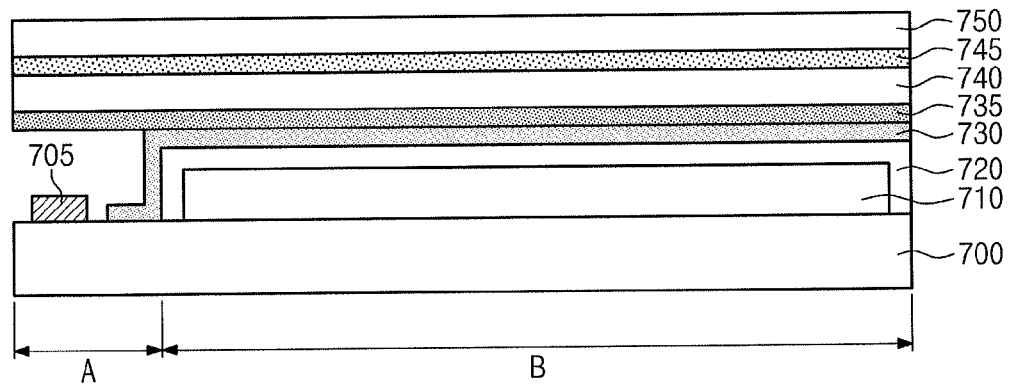
FIGS. 8 and 9 are schematic views illustrating an organic electroluminescence display apparatus according to another embodiment.
Figure 9:
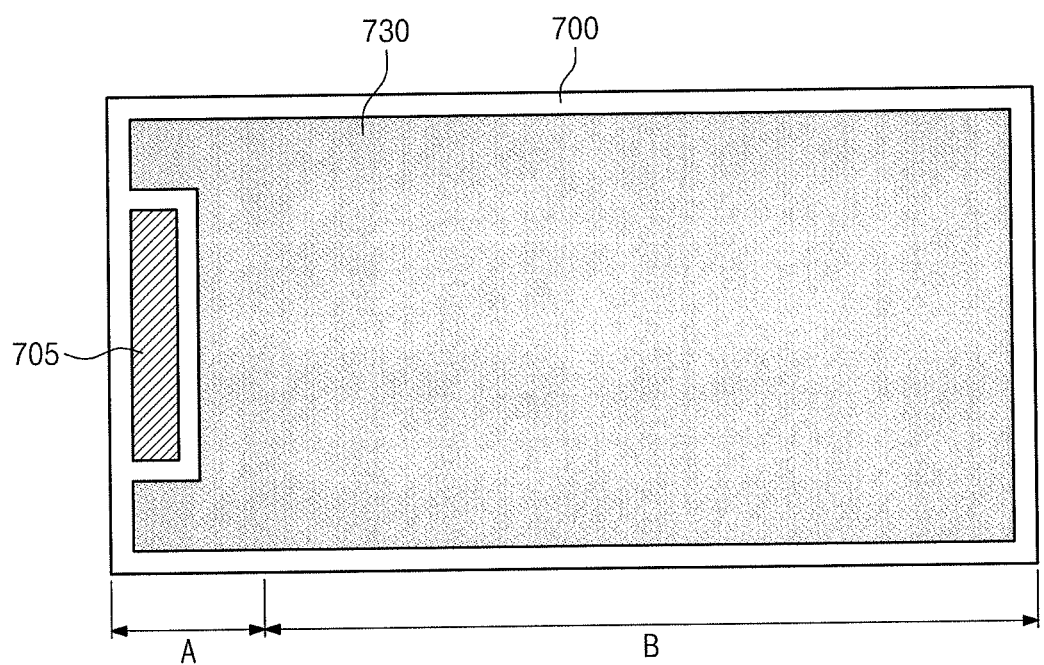

FIG. 8 is a schematic view illustrating an organic electroluminescence display apparatus according to another embodiment. FIG. 9 is a plan view of a polarizer in the display apparatus of FIG. 8. A detailed description elements described previously with reference to FIG. 1 will not be repeated herein.

Referring to FIGS. 8 and 9, a substrate 700 may include the non-image display region "A" and the image display region "B". An organic light emitting layer 710 may be disposed on the image display region "B". A thin film sealing layer 720 sealing the organic light emitting layer 710 may be disposed on the image display region "B". The thin film sealing layer 720 may be formed by repeatedly stacking organic layers and inorganic layers. A driver IC 705 may be disposed on the non-image display region A. The driver IC 705 may control the operation of the organic light emitting layer 710.

A polarizer 730 may be disposed on the thin film sealing layer 720. The polarizer 730 may extend from the image display region B to the non-image display region A. The polarizer 730 may be spaced apart from the driver IC 705 and surround at least two side surfaces of the driver IC 705. When the polarizer 730 surrounds the driver IC 705, the strength of a part around the driver IC 705 may be improved.

An optical resin layer 735 may be disposed on the polarizer 730. A touch screen panel 740 may be disposed on the optical resin layer 735. The optical resin layer 735 may adhere the polarizer 730 to the touch screen panel 740. A window layer 750 may be disposed on the touch screen panel 740. An optical adhesive 745 may be disposed between the touch screen panel 740 and the window layer 750.

According to the current embodiment, an organic electroluminescence display apparatus may include an integrated touch screen panel. The touch screen panel 740 integrally formed with the substrate 700, and the thin film sealing layer 720 may reduce thickness of the organic electroluminescence display apparatus. The polarizer 730 may improve the visual display of the organic electroluminescence display apparatus. The optical resin layer 735 and the optical adhesive 745 may increase manufacturing efficiency of the organic electroluminescence display apparatus. When the polarizer 730 surrounds the driver IC 705, the strength of a part around the driver IC 705 may be improved.

According to example embodiments, an organic electroluminescence display apparatus may include an integrated touch screen panel. The touch screen panel integrally formed with a substrate supporting the light emitting layer, and a thin film sealing layer between the touch screen layer and the light emitting layer may reduce overall thickness of the organic electroluminescence display apparatus. The polarizer may improve the visual display of the organic electroluminescence display apparatus. The optical resin layer and the optical adhesive may make it possible to efficiently fabricate the organic electroluminescence display apparatus.

The above-disclosed subject matter is to be considered illustrative and not restrictive, and the appended claims are intended to cover all such modifications, enhancements, and other embodiments, which fall within the true spirit and scope of the example embodiments. Thus, to the maximum extent allowed by law, the scope of the example embodiments is to be determined by the broadest permissible interpretation of the following claims and their equivalents, and shall not be restricted or limited by the foregoing detailed description.

What is claimed is:

1. An organic electroluminescence display apparatus, comprising:
    an organic light emitting layer disposed on a substrate;
    a thin film sealing layer on the organic light emitting layer, the thin film sealing layer being configured to seal the organic light emitting layer;
    a polarizer disposed on the thin film sealing layer;
    a touch screen panel disposed on the polarizer; and
    a window layer disposed on the touch screen panel.

2. The organic electroluminescence display apparatus of claim 1, further comprising a first optical adhesive between the touch screen panel and the window layer.

3. The organic electroluminescence display apparatus of claim 2, further comprising an optical resin layer configured to adhere the polarizer to the touch screen panel.

4. The organic electroluminescence display apparatus of claim 3, wherein the substrate includes an image display region and a non-image display region, the optical resin layer being on the image display region.

5. The organic electroluminescence display apparatus of claim 4, wherein the optical resin layer has a closed loop shape.

6. The organic electroluminescence display apparatus of claim 2, further comprising a second optical adhesive between the polarizer and the thin film sealing layer.

7. The organic electroluminescence display apparatus of claim 2, further comprising a third optical adhesive between the polarizer and the touch screen panel.

8. The organic electroluminescence display apparatus of claim 1, further comprising:
    a first optical resin layer adhering the polarizer to the touch screen panel; and
    a second optical resin layer adhering the window layer to the touch screen panel.

9. The organic electroluminescence display apparatus of claim 1, further comprising a driver integrated circuit on a non-image display region of the substrate.

10. The organic electroluminescence display apparatus of claim 9, wherein the organic light emitting layer, the thin film sealing layer, the polarizer, and the touch screen panel are disposed on an image display region of the substrate.

11. The organic electroluminescence display apparatus of claim 10, wherein the polarizer extends from the image display region to the non-image display region, the polarizer being spaced apart from the driver integrated circuit and surrounding at least two side surfaces of the driver integrated circuit.

12. The organic electroluminescence display apparatus of claim 11, wherein the touch screen panel extends from the image display region to the non-image display region.

13. The organic electroluminescence display apparatus of claim 1, wherein the touch screen panel and the organic light emitting layer share a single substrate.

14. The organic electroluminescence display apparatus of claim 1, wherein the thin film sealing layer consists essentially of a plurality of thin films.

* * * * *